(12) United States Patent
St. Hilaire

(10) Patent No.: US 7,787,107 B2
(45) Date of Patent: Aug. 31, 2010

(54) MOTION MEASUREMENT AND SYNCHRONIZATION USING A SCANNING INTERFEROMETER WITH GRATINGS

(75) Inventor: Pierre St. Hilaire, Belmont, CA (US)

(73) Assignee: AllView Research LLC, Belmont, CA (US)

( * ) Notice: Subject to any disclaimer, the term of this patent is extended or adjusted under 35 U.S.C. 154(b) by 251 days.

(21) Appl. No.: 12/152,856

(22) Filed: May 16, 2008

(65) Prior Publication Data
US 2008/0304045 A1 Dec. 11, 2008

Related U.S. Application Data

(60) Provisional application No. 60/930,751, filed on May 18, 2007.

(51) Int. Cl.
*G01P 3/36* (2006.01)
(52) U.S. Cl. .................................... 356/28.5
(58) Field of Classification Search ............... 356/28.5, 356/489, 499
See application file for complete search history.

(56) References Cited

U.S. PATENT DOCUMENTS

| | | | |
|---|---|---|---|
| 4,167,337 A | 9/1979 | Jaerisch et al. | |
| 4,525,068 A | 6/1985 | Mannava et al. | |
| 5,179,418 A * | 1/1993 | Takamiya et al. | 356/28.5 |
| 5,272,512 A * | 12/1993 | Kadowaki et al. | 356/28 |
| 5,502,466 A * | 3/1996 | Kato et al. | 356/499 |
| 5,552,879 A * | 9/1996 | Takamiya et al. | 356/28.5 |
| 5,574,560 A | 11/1996 | Franz et al. | |
| 6,765,724 B1 | 7/2004 | Kramer | |
| 6,859,267 B2 | 2/2005 | Dam-Hensen et al. | |
| 7,636,165 B2 * | 12/2009 | Klaver et al. | 356/499 |
| 2006/0033923 A1 | 2/2006 | Hirasawa et al. | |

* cited by examiner

*Primary Examiner*—Isam Alsomiri
(74) *Attorney, Agent, or Firm*—Van Pelt, Yi & James LLP (57) ABSTRACT

Indicating relative speed is disclosed. A first grating coupled to a first moving object is illuminated using a coherent light source to generate a first diffracted beam and a diffracted order beam. A second grating coupled to a second moving object is illuminated using the first diffracted beam and the second diffracted beam to generate a third diffracted beam and a fourth diffracted beam. The third diffracted beam and the fourth diffracted beam are measured. A relative speed of the first moving object with respect to the second moving object is indicated based at least in part on the measured third diffracted beam and the measured fourth diffracted beam.

47 Claims, 7 Drawing Sheets

MOTION MEASUREMENT AND SYNCHRONIZATION USING A SCANNING INTERFEROMETER WITH GRATINGS

CROSS REFERENCE TO OTHER APPLICATIONS

This application claims priority to U.S. Provisional Patent Application No. 60/930,751 entitled MOTION SYNCHRONIZATION USING A SCANNING INTERFEROMETER WITH GRATINGS filed May 18, 2007 which is incorporated herein by reference for all purposes.

BACKGROUND OF THE INVENTION

Interferometers have found many uses in precision motion control due to their high accuracy and sensitivity. In applications requiring these qualities, an interferometer compares the phase of a laser reflected from a mirror mounted on a moving surface (such as a translation stage) to a fixed phase reference to extract the motion of the moving surface with respect to the reference. Because the wavelength of light used for the interferometric measurement is around 0.5 microns, interferometers can achieve sub-micron (and in some cases sub-nanometer) accuracy. Conventional interferometers compare the phase of a retroreflected laser beam with respect to a stationary reference beam in order to measure motion. However, some types of applications, such as scanning photolithography, require the synchronization of parts that move parallel to each other (e.g., a mask and a wafer) while interacting with an imaging system that is fixed with respect to the world coordinates. In this case, the quantity to measure is the relative motion of the mask image with respect to the wafer, rather than the relative motion of the mask and wafer. In order to accurately perform this task, it is necessary for the laser beam reflected from the object to go through the same imaging optical path as does the actual mask exposure beam.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Motion measurement and synchronization using a scanning interferometer with gratings. A first grating coupled to a first moving object is illuminated using a coherent light source to generate a first diffracted beam and a second diffracted beam. A second grating coupled to a second moving object is illuminated using the first diffracted beam and a second diffracted beam to generate a third diffracted beam and a fourth diffracted beam. The third diffracted beam and fourth diffracted beam are measured. A relative speed of the first moving object and the second moving object is indicated based at least in part on the measured third diffracted beam and the fourth diffracted beam.

In some embodiments, a beam is diffracted by a first moving grating generating a +1 and −1 diffracted order beams. The +1 and −1 diffracted order beams are diffracted by a second moving grating generating a +1/−1 and a −1/+1 diffracted order beams that propagate in the same direction. The +1/−1 and −1/+1 diffracted order beams are measured on a detector. Relative motion between the first grating and the second grating can be determined using the measurement of the +1/−1 and −1/+1 diffracted order beams. The measurement provides an interferometric measurement of the relative motion of the two gratings.

Figure 1:
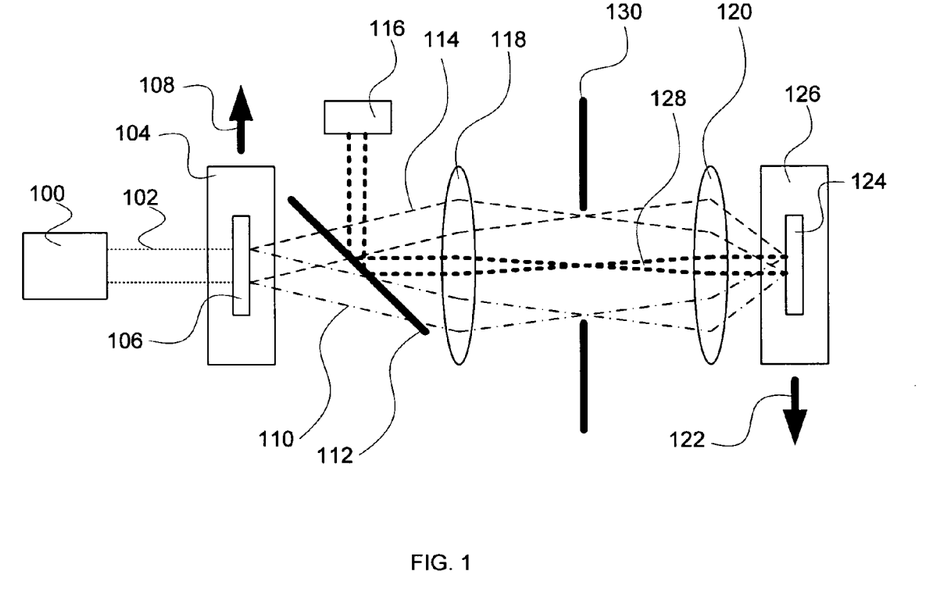
FIG. 1 is a block diagram illustrating an embodiment of a scanning interferometer with gratings.

FIG. 1 is a block diagram illustrating an embodiment of a scanning interferometer with gratings. In the example shown, coherent light source 100 illuminates grating 106 by being the source for a beam propagating along 102. Grating 106 is coupled to moving object 104 moving in a direction (e.g., a direction such as indicated by arrow 108). Illuminating grating 106 generates diffracted beams including two symmetric beams propagating along 114 and 110. In some embodiments, the two symmetric beams comprise the +1 and −1 order diffracted beams. Beams other than the diffracted beams of interest are blocked using stops (not shown in FIG. 1); For example, the zero$^{th}$ beam and/or higher order diffracted beams are blocked. The two symmetric beams are imaged by an optical system represented by lens 118 and lens 120 onto grating 124. In various embodiments, the optical system comprises a single lens, a group of lenses, two lens groups, two lens groups comprising an afocal telescope, an imaging system with a magnification factor (e.g., magnification M) such as is similar to a microscope, or any other appropriate optical system.

Grating 124 is coupled to moving object 126 moving in a direction (e.g., a direction such as indicated by arrow 122. The two symmetric beams are diffracted by grating 124. Two of the diffracted orders (e.g., the +1/−1 and the −1/+1 diffracted orders) as diffracted by grating 124 propagate in the same direction along 128. These two diffraction orders pass back through the optical system and are directed to detector 116 using beamsplitter 112. Other diffraction orders generated by illuminating grating 124 by the two symmetric beams are blocked (e.g., using a stop as represented by stop 130 in FIG. 1).

In some embodiments, grating 106 and grating 124 are coupled to object 104 and object 126, respectively, whose relative motion is measured. In various embodiments, object 104 and/or object 126 are coupled to or comprise a mask or a wafer in a semiconductor stepper or photolithographic production device. In various embodiments, grating 106 and/or grating 124 comprise a sinusoidal grating, a spatial light modulator, a surface grating, a blazed grating, or any other appropriate grating. In various embodiments, grating 106 and grating 124 comprise 1-dimensional gratings, 2-dimensional gratings, or any other appropriate type of grating. In some embodiments, grating 106 and grating 124 move in parallel planes, although strict parallelism is not required. In some embodiments, grating 106 comprises a transmission grating. In some embodiments, grating 124 comprises a reflection grating.

Figure 2:
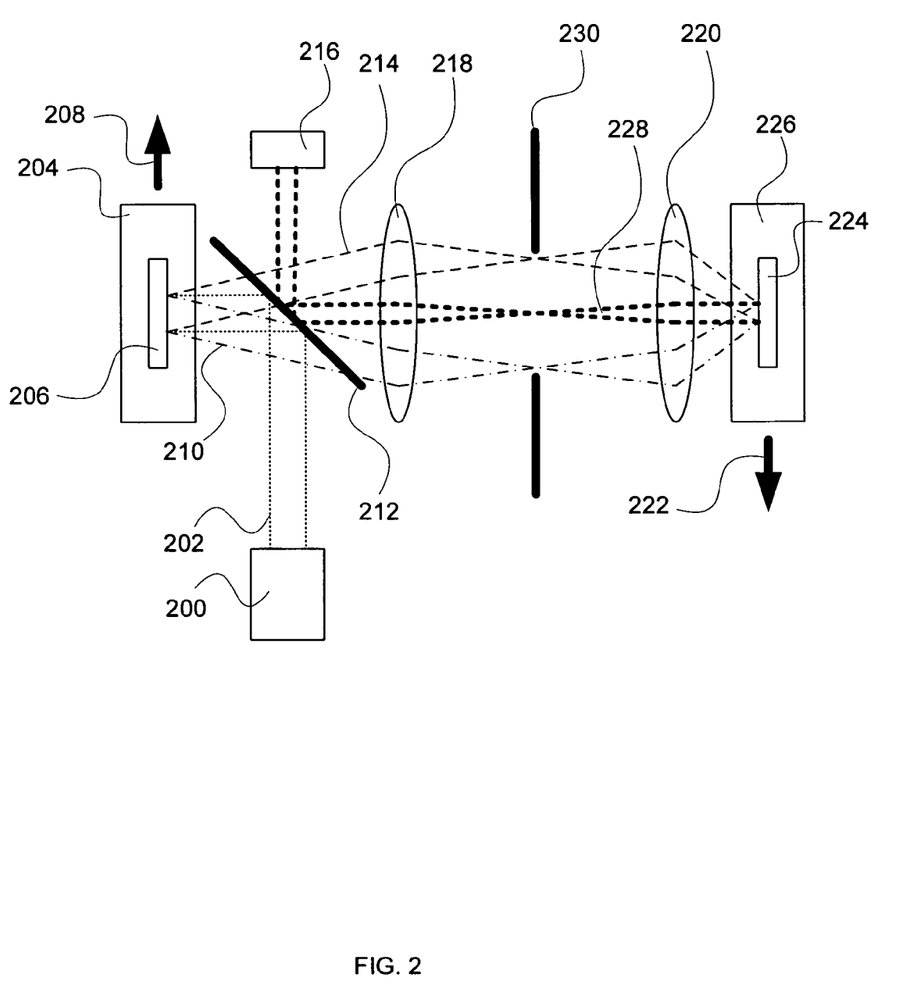
FIG. 2 is a block diagram illustrating an embodiment of a scanning interferometer with gratings.

FIG. 2 is a block diagram illustrating an embodiment of a scanning interferometer with gratings. In the example shown, coherent light source 200 illuminates grating 206 by being the source for a beam propagating along 202 and reflecting off of beam splitter 212. Grating 206 is coupled to moving object 204 moving in a direction (e.g., a direction such as indicated by arrow 208). Illuminating grating 206 generates diffracted beams including two symmetric beams propagating along 214 and 210. In some embodiments, the two symmetric beams comprise the +1 and −1 order diffracted beams. Beams other than the diffracted beams of interest are blocked using stops (not shown in FIG. 1); For example, the zero$^{th}$ beam and/or higher order diffracted beams are blocked. The two symmetric beams are imaged by an optical system represented by lens 218 and lens 220 onto grating 224. In various embodiments, the optical system comprises a single lens, a group of lenses, two lens groups, two lens groups comprising an afocal telescope, an imaging system with a magnification factor (e.g., magnification M) such as is similar to a microscope, or any other appropriate optical system.

Grating 224 is coupled to moving object 226 moving in a direction (e.g., a direction such as indicated by arrow 222. The two symmetric beams are diffracted by grating 224. Two of the diffracted orders (e.g., the +1/−1 and the −1/+1 diffracted orders) as diffracted by grating 224 propagate in the same direction along 228. These two diffraction orders pass back through the optical system and are directed to detector 216 using beamsplitter 212. Other diffraction orders generated by illuminating grating 224 by the two symmetric beams are blocked (e.g., using a stop as represented by stop 230 in FIG. 2).

In some embodiments, grating 206 and grating 224 are coupled to object 204 and object 226, respectively, whose relative motion is measured. In various embodiments, object 204 and/or object 226 are coupled to or comprise a mask or a wafer in a semiconductor stepper or photolithographic production device. In various embodiments, grating 206 and/or grating 224 comprise a sinusoidal grating, a spatial light modulator, a surface grating, a blazed grating, or any other appropriate grating. In various embodiments, grating 206 and grating 224 comprise 1-dimensional gratings, 2-dimensional gratings, or any other appropriate type of grating. In some embodiments, grating 206 and grating 224 move in parallel planes, although strict parallelism is not required. In some embodiments, grating 206 comprises a reflection grating. In some embodiments, grating 224 comprises a reflection grating.

In some embodiments, source 200 comprises two coherent laser sources (e.g., two lasers) that are configured to produce a collinear output using one or more beam splitters. For example, the two lasers each generate an output beam where the two output beams are initially propagating orthogonally to each other. The two output beams are directed along one of the output beam directions by redirecting the other orthogonal beam using a beams splitter.

Figure 3:
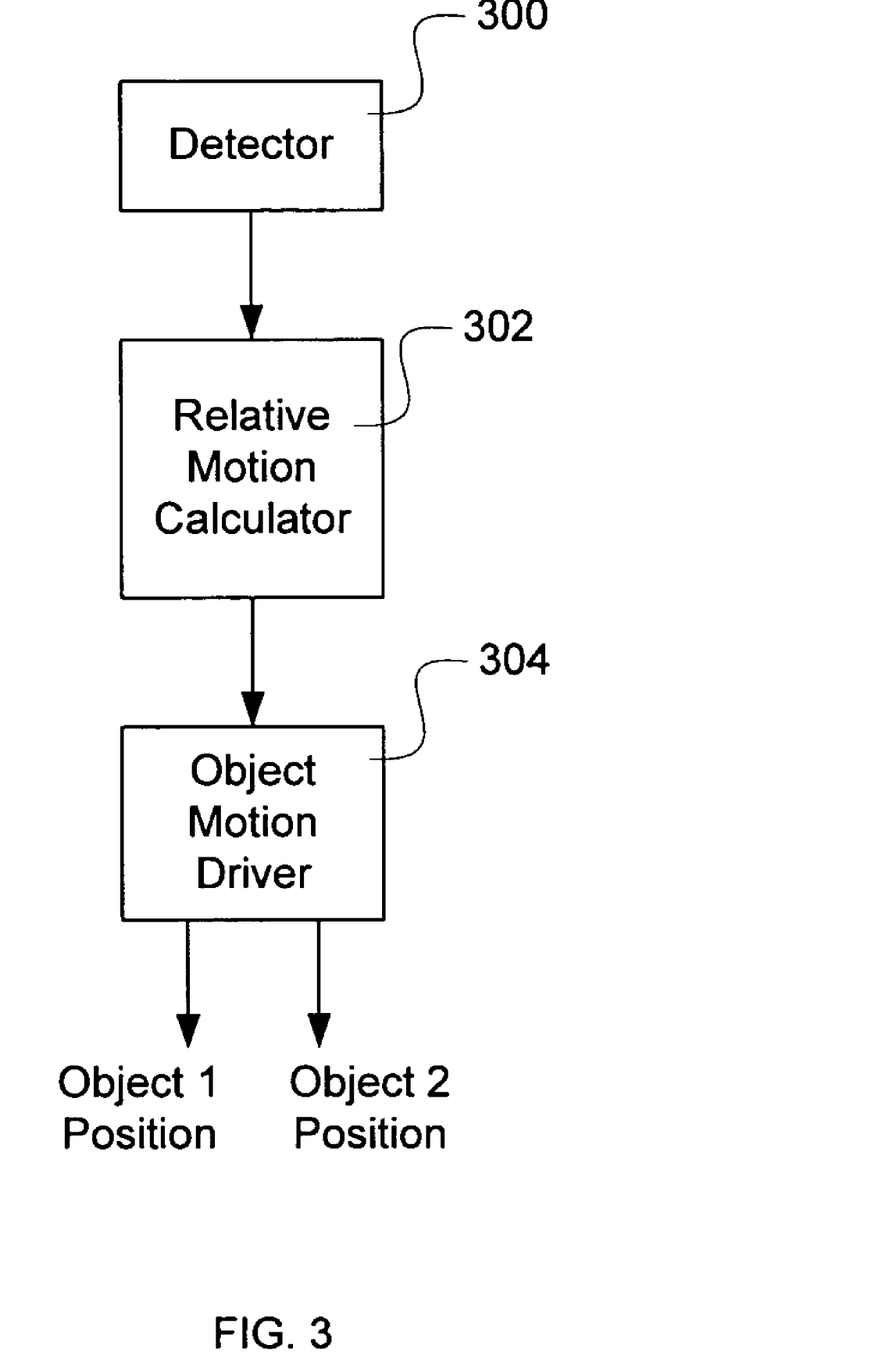
FIG. 3 is a block diagram illustrating an embodiment of a system for processing a signal from a detector.

FIG. 3 is a block diagram illustrating an embodiment of a system for processing a signal from a detector. In the example shown, the output of detector 116 is amplified and processed by relative motion calculator 302. In some embodiments, relative motion calculator 302 comprises a demodulator. Relative motion calculator 302 outputs a signal indicating relative motion to object motion driver 304. Object motion driver 304 is able to control the relative motion of two objects (e.g., object 1 and object 2 such as object 104 and object 126 of FIG. 1 or object 204 and 226 of FIG. 2) such that the two objects move in a synchronized manner. In some embodiments, object motion driver 304 includes a servo control system.

The principle behind relative motion calculator 302 is as follows: as a first grating (e.g., grating 106 of FIG. 1 and/or grating 206 of FIG. 2) translates the +1 and −1 diffracted orders are Doppler frequency shifted by +1 and −1 respectively. The Doppler frequency shift is related to the translation speed v and to the spatial frequency $f_1$ of the grating by the formula:

$$\Delta\omega = \pm 2\pi v f_1$$

Upon diffraction from a second grating (e.g., grating 124 of FIG. 1 or grating 224 of FIG. 2) the +1 and −1 orders are diffracted along the optical axis with the respective angular frequency differences:

$$\Delta\omega = \pm 2\pi(v_1 f_1 - v_2 f_2)$$

A detector (e.g., detector 116 and/or detector 216) placed along the optical axis will thus produce a signal having the angular frequency:

$$\Delta\omega = 4\pi(v_1 f_1 - v_2 f_2)$$

In particular, if $f_2 = f_1 M$ and $v_2 = (v_1/M) + \Delta v$, where M is the magnification of the imaging system between the gratings, we get the result:

$$\omega = 4\pi f_1 M \Delta v$$

which allows a direct measurement of the speed variation $\Delta v$ from the detector signal. The detector signal can then be used as an error signal to synchronize the relative linear speed of the first grating with respect to the second grating using a feedback loop.

In some embodiments, the single detector is replaced by a pair or a linear array, which allows extracting information regarding the movement of the gratings from the quadrature information contained in the interferometric fringes. The technique can be readily applied to the 2-dimensional case by using pairs of orthogonal gratings and a two-dimensional detector array. In the 2-dimensional case, the movement can be measured in each of the two dimensions.

Figure 4:
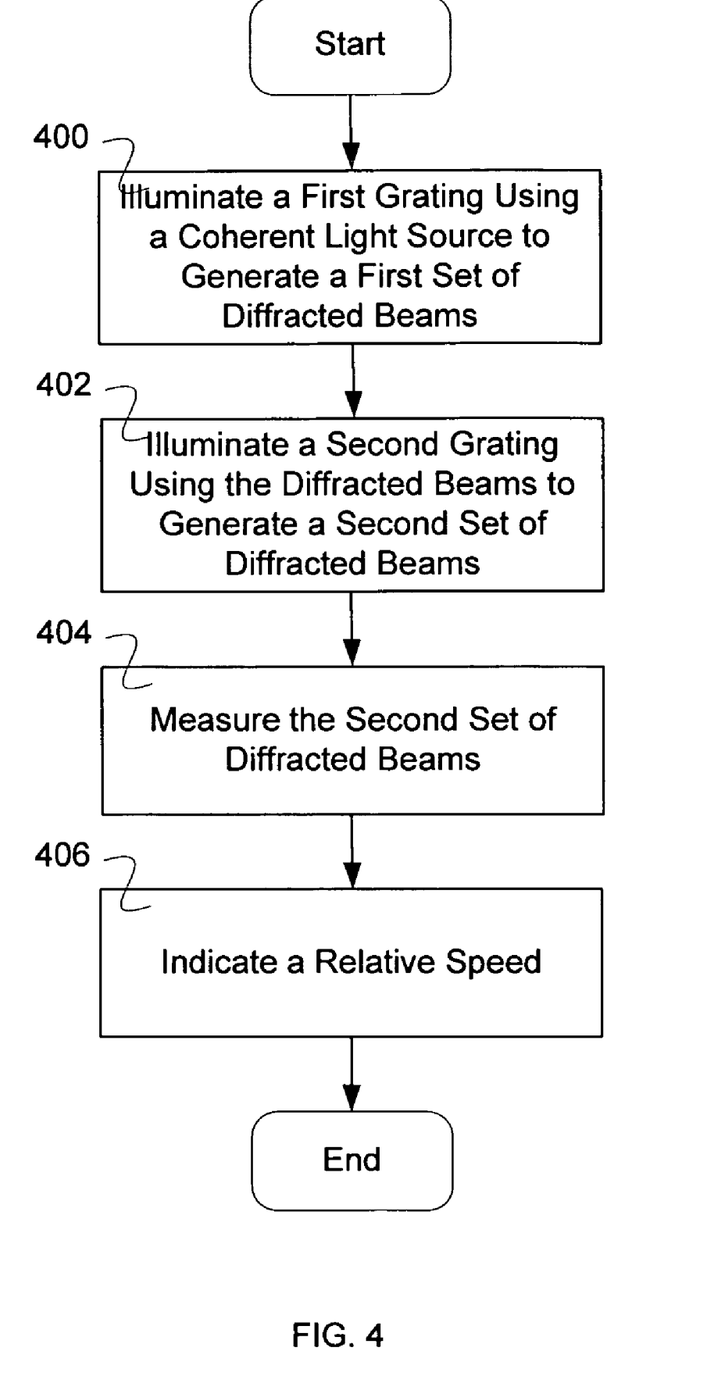
FIG. 4 is a flow diagram illustrating an embodiment of a process for indicating a relative speed.

FIG. 4 is a flow diagram illustrating an embodiment of a process for indicating a relative speed. In the example shown, in 400 a first grating is illuminated using a coherent light source to generate a first set of diffracted beams. For example, a laser illuminates a first grating moving in a first direction to generate a +1 and a −1 order diffracted beams. In 402, a second grating is illuminated using the first set of diffracted beams to generate a second set of diffracted beams. For example, the +1 and the −1 order diffracted beams illuminate a second grating moving in a second direction to generate a +1/−1 and a −1/+1 order diffracted beams. In 404, the second set of diffracted beams are measured. For example, an interferometric measurement is made by measuring the second set of diffracted beams enabling the ability to measure the relative motion of the first grating with respect to the second grating and/or any objects coupled to the first grating and second grating. In 406, a relative speed is indicated. In some embodiments, the relative speed is used to synchronize the motion of the first grating and the second grating using a servo system.

FIGS. 5A, 5B, 5C, and 5D are block diagrams illustrating embodiments of gratings. In the example shown in FIG. 5A, object 500 is coupled to grating 502. Grating 502 enables a position measurement along a linear dimension (e.g., along the line indicated by 504). In some embodiments, grating 502 is visible using an imaging system such as an imaging system projecting a mask onto a substrate (e.g., object 500). In some embodiments, in the event that the interferometric measurement beam path is collinear with a writing beam path, any perturbation introduced in the writing beam (such as a vibration in the imaging optical system) is detectable by the measurement of diffracted beams from a second grating (e.g., grating 124 of FIG. 1 or grating 224 of FIG. 2).

Figure 5A:
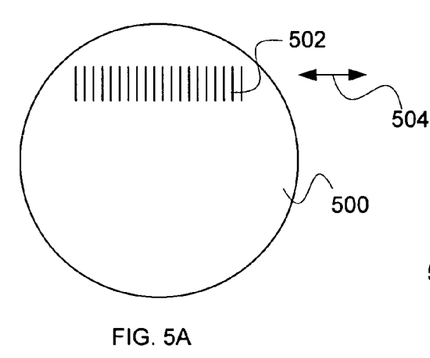
FIGS. 5A, 5B, 5C, and 5D are block diagrams illustrating embodiments of gratings.
Figure 5B:
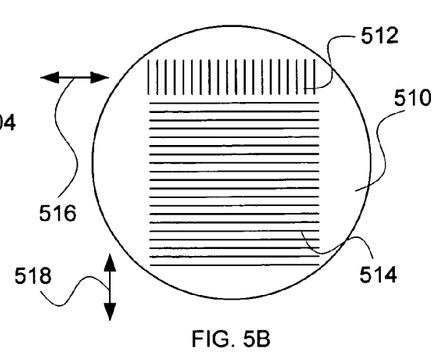

In the example shown in FIG. 5B, object 510 is coupled to grating 512 and grating 514. Grating 512 enables a position measurement along a linear dimension (e.g., along the line indicated by 516). Grating 514 enables a position measurement along a linear dimension (e.g., along the line indicated by 518). In some embodiments, grating 512 and/or grating 514 is/are visible using an imaging system such as an imaging system projecting a mask onto a substrate (e.g., object 510). In some embodiments, in the event that the interferometric measurement beam path is collinear with a writing beam path, any perturbation introduced in the writing beam (such as a vibration in the imaging optical system) is detectable by the measurement of diffracted beams from a second grating (e.g., grating 124 of FIG. 1 or grating 224 of FIG. 2).

Figure 5C:
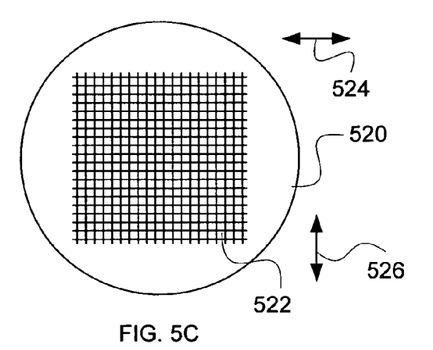

In the example shown in FIG. 5C, object 520 is coupled to grating 522. Grating 522 enables a position measurement along two linear dimensions (e.g., along the lines indicated by 524 and 526). In some embodiments, grating 522 is visible using an imaging system such as an imaging system projecting a mask onto a substrate (e.g., object 520). In some embodiments, in the event that the interferometric measurement beam path is collinear with a writing beam path, any perturbation introduced in the writing beam (such as a vibration in the imaging optical system) is detectable by the measurement of diffracted beams from a second grating (e.g., grating 124 of FIG. 1 or grating 224 of FIG. 2).

Figure 5D:
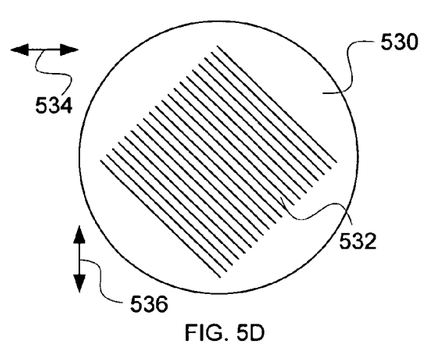

In the example shown in FIG. 5D, object 530 is coupled to grating 532. Grating 532 enables a position measurement along two linear dimensions (e.g., along the lines indicated by 534 and 536). In some embodiments, grating 532 is visible using an imaging system such as an imaging system projecting a mask onto a substrate (e.g., object 530). In some embodiments, in the event that the interferometric measurement beam path is collinear with a writing beam path, any perturbation introduced in the writing beam (such as a vibration in the imaging optical system) is detectable by the measurement of diffracted beams from a second grating (e.g., grating 124 of FIG. 1 or grating 224 of FIG. 2).

Figure 6:
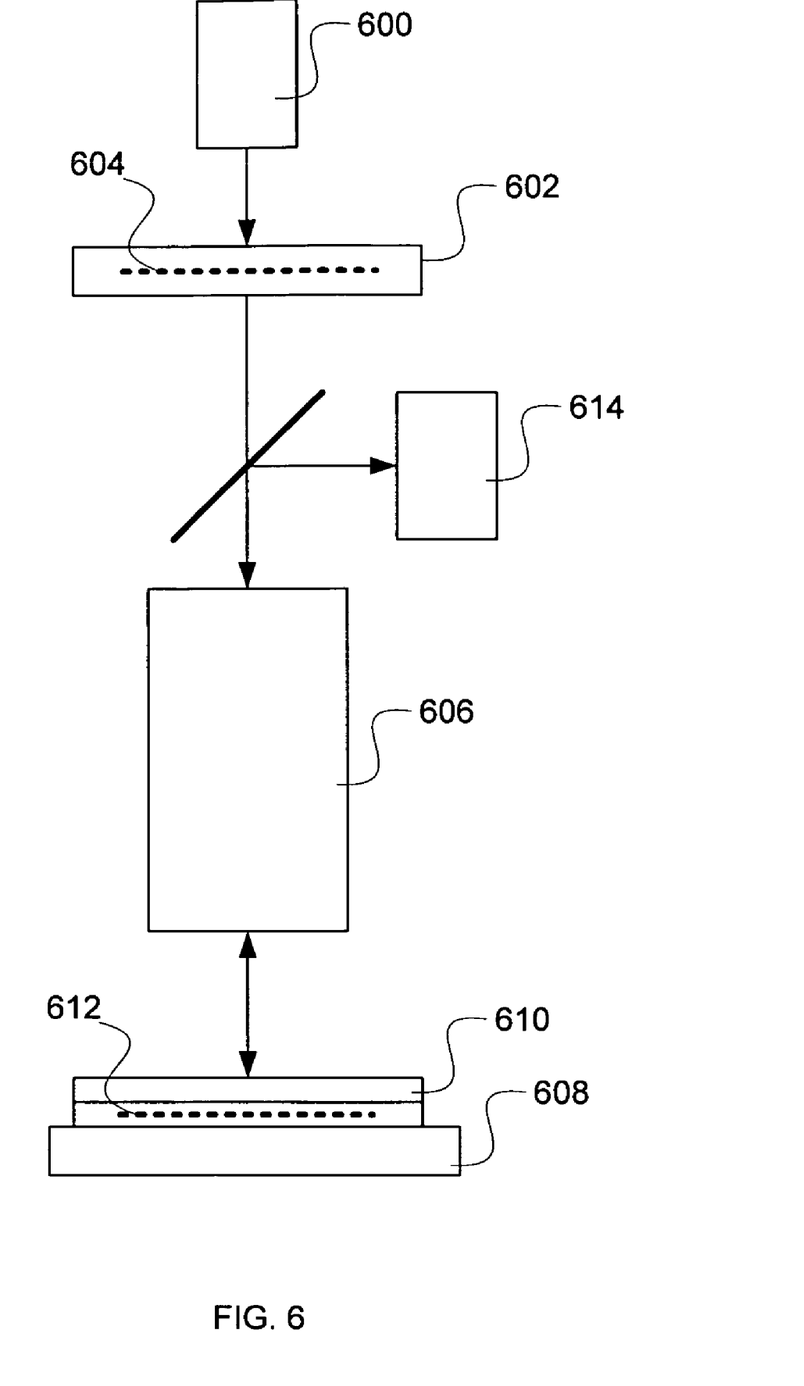
FIG. 6 is a block diagram illustrating an embodiment of a system for photolithography.

FIG. 6 is a block diagram illustrating an embodiment of a system for photolithography. In the example shown, a system for photolithography includes light source 600, transmissive mask 602 including grating 604, imaging system 606, substrate 608 with which photosensitive layer 610 and grating 612 are coupled. Light source 600 includes a writing beam source and a measurement beam source (e.g., a UV source and an infrared source, respectively). Grating 604 and grating 612 comprise gratings that only diffract the measurement beam wavelength and not the writing beam wavelength (e.g., Bragg selective volume holograms). Detector 614 measures beams diffracted from grating 604 and grating 612 that interfere with one another to provide an indication of the relative motion between transmissive mask 612 and substrate 608.

In some embodiments, the positions of a first grating (e.g., grating 106 of FIG. 1 or grating 206 of FIG. 2) and a second grating (e.g., grating 124 of FIG. 1 or grating 224 of FIG. 2) are displaced with respect to the mask and wafer, so that they are not in the path of a write beam. This avoids the use of difficult to make Bragg selective gratings.

Figure 7A:
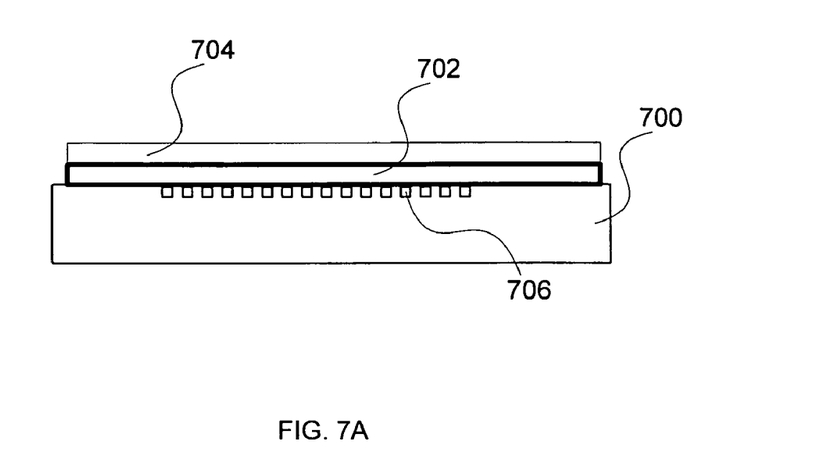
FIGS. 7A, 7B and 7C are block diagrams illustrating embodiments of gratings.

FIGS. 7A, 7B, and 7C are block diagrams illustrating embodiments of gratings. In the example shown in FIG. 7A, object 700 (e.g., a substrate) has absorptive layer 702 beneath photosensitive layer 704, but above grating 706. Absorptive layer 702 is designed to block a writing light for photosensitive layer 704 from seeing grating 706 and potentially diffracting back, while letting the measuring light rays pass through (e.g., the light rays used for an interferometric measurement).

Figure 7B:
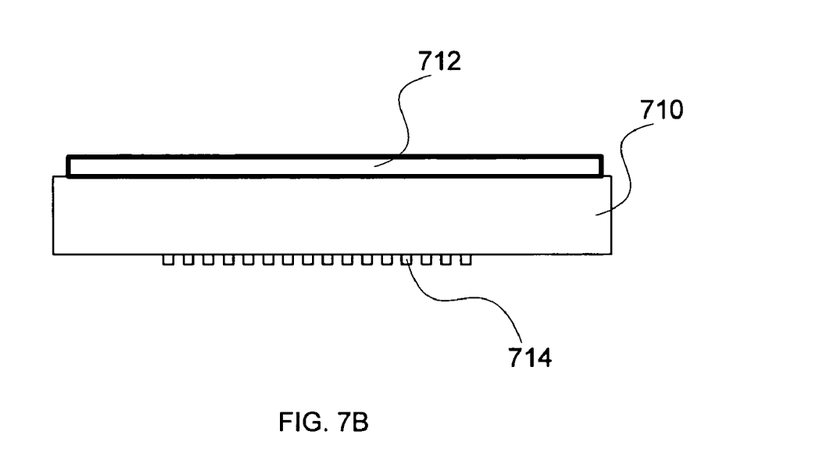

In the example shown in FIG. 7B, object 710 (e.g., a substrate) is an absorptive layer beneath photosensitive layer 712, but above grating 714. Absorptive layer 710 is designed to block a writing light for photosensitive layer 712 from seeing grating 714 and potentially diffracting back, while letting the measuring light rays pass through (e.g., the light rays used for an interferometric measurement). For example, object 710 comprises a silicon wafer, which itself acts as a blocking layer, and the measuring light rays are of a wavelength for which the silicon wafer is transparent (e.g., near infrared).

Figure 7C:
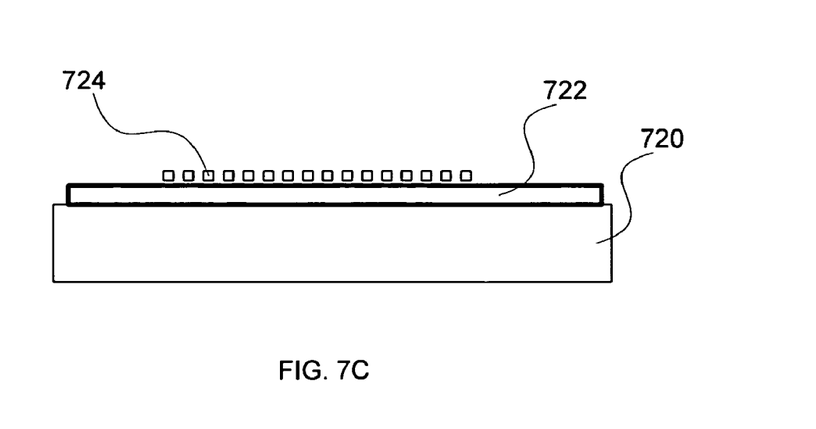

In the example shown in FIG. 7C, object 720 (e.g., a substrate) is beneath photosensitive layer 722 which in turn is beneath grating 724. In some embodiments, grating 724 is designed to only diffract an incident measurement beam, and a writing beam is unaffected by grating 724. In some embodiments, grating 724 is designed to diffract a writing beam to affect the areas in which photosensitive layer 722 is exposed.

In some embodiments, a pixelated spatial light modulator (SLM) is used instead of a fixed mask as an image source—for example, in some maskless lithography applications. In this case, the periodic pixelated structure of the SLM acts as the diffractive element (e.g., a grating such as grating 106 or 206), thus eliminating the need for separate grating on the object side of the imaging system. This feature is particularly attractive in the case where a pixelated SLM is used to modulate the phase of the writing beam rather than its amplitude, for example in the interferometric writing of periodic structures for photonic applications.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for indicating relative speed comprising:
    illuminating a first grating coupled to a first moving object using a coherent light source to generate a first diffracted beam and a second diffracted beam;
    illuminating a second grating coupled to a second moving object using the first diffracted beam and the second diffracted beam to generate a third diffracted beam and a fourth diffracted beam;
    measuring the third diffracted beam and the fourth diffracted beam;
    indicating a relative speed of the first moving object with respect to the second moving object based at least in part on the measured third diffracted beam and the measured fourth diffracted beam.

2. A method as in claim 1, wherein the coherent light source comprises a laser.

3. A method as in claim 1, wherein the first diffracted beam comprises a +1 order diffracted beam and the second diffracted beam comprises a −1 order diffracted beam.

4. A method as in claim 1, wherein the first diffracted beam is generated by being diffracted by a transmission grating.

5. A method as in claim 4, wherein the transmission grating comprises a spatial light modulator.

6. A method as in claim 1, wherein the second diffracted beam is generated by being diffracted by a transmission grating.

7. A method as in claim 6, wherein the transmission grating comprises a spatial light modulator.

8. A method as in claim 1, wherein the first diffracted beam is generated by being diffracted by a reflection grating.

9. A method as in claim 1, wherein the third diffracted beam comprises a +1 order diffracted beam and the fourth diffracted beam comprises a −1 order diffracted beam.

10. A method as in claim 1, wherein the third diffracted beam is generated by being diffracted by a reflection grating.

11. A method as in claim 1, wherein the fourth diffracted beam is generated by being diffracted by a reflection grating.

12. A method as in claim 1, wherein measuring the third diffracted beam and the forth diffracted beam uses a detector.

13. A method as in claim 12, wherein the third diffracted beam and the forth diffracted beam interfere with each other and are measured using the detector.

14. A method as in claim 12, wherein the detector comprises one of the following: a photodiode, a CMOS array detector, a CCD array detector, an avalanche photo detector, or an avalanche photo detector array.

15. A method as in claim 1, wherein indicating a relative speed of the first moving object with respect to the second moving object comprises indicating a relative speed in one dimension.

16. A method as in claim 1, wherein indicating a relative speed of the first moving object with respect to the second moving object comprises indicating a relative speed in two dimensions.

17. A method as in claim 1, wherein indicating a relative speed of the first moving object with respect to the second moving object comprises indicating a relative speed based at least in part on a spatial frequency of the first diffraction grating and a speed of the first diffraction grating.

18. A method as in claim 1, wherein indicating a relative speed of the first moving object with respect to the second moving object comprises indicating a relative speed based at least in part on a spatial frequency of the second diffraction grating and a speed of the second diffraction grating.

19. A method as in claim 1, wherein the first diffracted beam and second diffracted beam pass through one or more optical elements before illuminating the second diffraction grating.

20. A method as in claim 19, wherein the one or more optical elements comprise one or more lenses.

21. A method as in claim 20, wherein the one or more lenses comprise an imaging system having a magnification M.

22. A method as in claim 21, wherein the second diffraction grating has a spatial frequency substantially similar to M times a spatial frequency of the first diffraction grating.

23. A method as in claim 1, further comprising synchronizing the motion of the first object and the second object based at least in part on the indication of relative speed.

24. A system for indicating relative speed, comprising:
    a first grating;
    a first moving object coupled to the first grating;
    a coherent light source, wherein the coherent light source illuminates the first grating to generate a first diffracted beam and a second diffracted beam;
    a second grating
    a second moving object coupled to the second grating, wherein the first diffracted beam and the second diffracted beam illuminates the second grating to generate a third diffracted beam and a fourth diffracted beam;
    a detector, wherein the detector measures the third diffracted beam and the fourth diffracted beam;
    an indicator, wherein the indicator indicates the relative speed of the first moving object with respect to the second moving object based at least in part on the measured third diffracted beam and the measured fourth diffracted beam.

25. A system as in claim 24, wherein the coherent light source comprises a laser.

26. A system as in claim 24, wherein the first diffracted beam comprises a +1 order diffracted beam and the second diffracted beam comprises a −1 order diffracted beam.

27. A system as in claim 24, wherein the first diffracted beam is generated by being diffracted by a transmission grating.

28. A system as in claim 27, wherein the transmission grating comprises a spatial light modulator.

29. A system as in claim 24, wherein the second diffracted beam is generated by being diffracted by a transmission grating.

30. A system as in claim 29, wherein the transmission grating comprises a spatial light modulator.

31. A system as in claim 24, wherein the first diffracted beam is generated by being diffracted by a reflection grating.

32. A system as in claim 24, wherein the third diffracted beam comprises a +1 order diffracted beam and the fourth diffracted beam comprises a −1 order diffracted beam.

33. A system as in claim 24, wherein the third diffracted beam is generated by being diffracted by a reflection grating.

34. A system as in claim 24, wherein the fourth diffracted beam is generated by being diffracted by a reflection grating.

35. A system as in claim 24, wherein measuring the third diffracted beam and the forth diffracted beam uses a detector.

36. A system as in claim 35, wherein the third diffracted beam and the forth diffracted beam interfere with each other and are measured using the detector.

37. A system as in claim 35, wherein the detector comprises one of the following: a photodiode, a CMOS array detector, a CCD array detector, an avalanche photo detector, or an avalanche photo detector array.

38. A system as in claim 24, wherein the indicator indicates a relative speed of the first moving object with respect to the second moving object in one dimension.

39. A system as in claim 24, wherein the indicator indicates a relative speed of the first moving object with respect to the second moving object in two dimensions.

40. A system as in claim 24, wherein the indicator indicates a relative speed of the first moving object with respect to the second moving object based at least in part on a spatial frequency of the first diffraction grating and a speed of the first diffraction grating.

41. A system as in claim 24, wherein the indicator indicates a relative speed of the first moving object with respect to the second moving object based at least in part on a spatial frequency of the second diffraction grating and a speed of the second diffraction grating.

42. A system as in claim 24, wherein the first diffracted beam and second diffracted beam pass through one or more optical elements before illuminating the second diffraction grating.

43. A system as in claim 42, wherein the one or more optical elements comprise one or more lenses.

44. A system as in claim 43, wherein the one or more lenses comprise an imaging system having a magnification M.

45. A system as in claim 44, wherein the second diffraction grating has a spatial frequency substantially similar to M times a spatial frequency of the first diffraction grating.

46. A system as in claim 24, further comprising a synchronizer for synchronizing the motion of the first object and the second object based at least in part on the indication of relative speed.

47. A system as in claim 24, wherein the second moving object is coupled to a photosensitive material that is exposed using a writing beam.

\* \* \* \* \*